United States Patent
Sun et al.

(10) Patent No.: US 11,089,719 B2
(45) Date of Patent: Aug. 10, 2021

(54) COMPUTER ROOM HEAT-PIPE AIR CONDITIONING SYSTEM WITH EMERGENCY COOLING FUNCTION AND CONTROL AND METHOD THEREOF

(71) Applicant: CHANGSHA UNIVERSITY OF SCIENCE AND TECHNOLOGY, Changsha (CN)

(72) Inventors: Xiaoqin Sun, Changsha (CN); Jie Li, Changsha (CN); Shuguang Liao, Changsha (CN)

( * ) Notice: Subject to any disclaimer, the term of this patent is extended or adjusted under 35 U.S.C. 154(b) by 0 days.

(21) Appl. No.: 16/942,519

(22) Filed: Jul. 29, 2020

(65) Prior Publication Data
US 2021/0045265 A1 Feb. 11, 2021

(51) Int. Cl.
*H02K 7/20* (2006.01)
*F25B 25/00* (2006.01)
*H05K 7/20* (2006.01)

(52) U.S. Cl.
CPC ....... *H05K 7/20827* (2013.01); *F25B 25/005* (2013.01); *H05K 7/20309* (2013.01); *H05K 7/20318* (2013.01); *H05K 7/20336* (2013.01)

(58) Field of Classification Search
CPC .......... H05K 7/20827; H05K 7/20309; H05K 7/20318; H05K 7/20336; F25B 25/005
See application file for complete search history.

(56) References Cited

U.S. PATENT DOCUMENTS

2016/0076821 A1* 3/2016 Kopko .............. F25B 7/00
  165/10
2018/0106510 A1* 4/2018 Brown .............. F25B 49/02

FOREIGN PATENT DOCUMENTS

WO  WO-2014192252 A1 * 12/2014 ........... F25B 23/006

OTHER PUBLICATIONS

Translation of WO2014192252A1 (Year: 2014).*

* cited by examiner

*Primary Examiner* — Marc E Norman
*Assistant Examiner* — Schyler S Sanks
(74) *Attorney, Agent, or Firm* — Jie Tan; JT Law Services, PC

(57) ABSTRACT

A computer room heat-pipe air conditioning system with an emergency cooling control method. The system comprises a phase-change energy storage module, a phase-change material packaging body, a condenser housing, a condenser, a cold releasing pump, evaporators, evaporation fans, four three-way valves, a cooling unit, standby power generators and storage batteries. The three-way valves are opened and closed based on a preset heat-pipe cooling criteria in combination with phase-change energy storage technology.

8 Claims, 4 Drawing Sheets

COMPUTER ROOM HEAT-PIPE AIR CONDITIONING SYSTEM WITH EMERGENCY COOLING FUNCTION AND CONTROL AND METHOD THEREOF

CROSS-REFERENCE

Priority is claimed from China Patent Application No. 201910728698.1 filed on Aug. 8, 2019, which is hereby incorporated by reference.

DESCRIPTION OF RELATED ART

The invention relates to a heat pipe air conditioning system with a room for emergency cooling and a control method thereof, and belongs to the technical field of air conditioning engineering.

With the development of communication technology, the feature size of communication chips has been reduced by more than 100 times in ten years, which has led to an increase in the power of electronic component modules, and the heat flow density per unit area has increased, and the heat dissipation problem has become an influence. The problem of chip performance needs to be solved. As the power density of a single cabinet increases, the rate of temperature rise caused by cooling failure gradually increases, and IT equipment overheats, causing server performance degradation or hardware damage, resulting in irreparable economic losses, and even endangering personal safety and social stability. According to preliminary statistics, 25% of communication failures are caused by excessive temperature in the data center caused by municipal power outage or refrigeration equipment failure, and the cost of one downtime is as high as 2.4 million US dollars.

Therefore, for high heat density data centers, it is necessary to design a compact and reliable cooling technology to ensure continuous cooling of the refrigeration system.

SUMMARY

The present invention solves the problem of temperature rise in the data center when a municipal power failure or refrigeration equipment fails, and proposes a heat pipe air conditioning system with an emergency cooling function to ensure continuity of cooling.

The technical solution provided by the present invention is:

A room heat pipe air conditioning system with emergency cooling function, comprising a refrigeration unit, a phase change energy storage module, a phase change material package, a condenser casing, a condenser, an evaporator, a backup generator and a battery; The phase change material package is located in the phase change energy storage module; the condenser is located in the condenser housing; and the condenser and the evaporator are connected by a pipeline to form a refrigerant circulation loop (evaporator and condenser) Through the connection between the liquid pipe and the gas pipe, the circulation of the Freon working medium is ensured; between the refrigeration unit and the condenser casing, between the refrigeration unit and the phase change energy storage module, the phase change energy storage module and the condenser a cold water circulation loop is formed between the outer casings through pipelines.

A valve is installed between the refrigeration unit and the condenser casing, between the refrigeration unit and the phase change energy storage module, and between the phase change energy storage module and the condenser casing.

The chilled water provided by the refrigeration unit can be supplied to the phase change energy storage module and the condenser at the same time. The circulating water volume can be adjusted by the valve opening degree on the relevant pipeline.

A cooling pump is installed on the pipeline between the phase change energy storage module and the condenser casing, and the cooling pump is used to promote circulation of the cold water working medium between the phase change energy storage module and the condenser casing.

An evaporator fan is mounted on the evaporator.

The working energy of the refrigeration unit is provided by the mains or backup generator. The working energy of the evaporating fan is provided by the mains, backup generator or battery. The working energy of the cooling pump is provided by the mains or battery. Under normal circumstances, the refrigeration unit, the evaporating fan and the cooling pump are all supplied with working voltage by the mains. When the mains is out of power, the refrigerating unit is powered by the standby generator; after the mains fails, the standby generator drives the refrigeration unit to work. The battery temporarily supplies power to the cooling pump and the evaporating fan, and adopts emergency cooling conditions; after the standby generator drives the refrigeration unit, the backup generator supplies power to the evaporating fan.

The equipment room heat pipe air conditioning system with emergency cooling function controls the operating conditions in different environments by controlling the switches of each valve.

Further, the valve is a three-way valve, and the specific connection method is:

The first inlet and outlet of the first three-way valve are connected to the outlet of the refrigeration unit through a pipeline, and the second and third inlets and outlets are respectively connected to the inlet of the phase change energy storage module and the condenser casing through a pipeline; the fourth three-way The first and second inlets and outlets of the valve are respectively connected to the outlet of the phase change energy storage module and the condenser casing through a pipeline, the third inlet and outlet are connected to the inlet of the refrigeration unit; and the second inlet and outlet of the first three-way valve are connected to the phase change energy storage A second three-way valve is disposed on the pipeline of the module, the first and second inlets and outlets of the second three-way valve are disposed on the pipeline, and the third inlet and outlet are connected to the inlet of a cooling pump through the pipeline, and the outlet of the cooling pump passes through The line is connected to the first inlet and outlet of the third three-way valve, and the second and third inlets and outlets of the third three-way valve are disposed on the third inlet and outlet of the first three-way valve to the line of the condenser casing.

Further, the equipment room heat pipe air conditioning system with emergency cooling function further includes a control system.

The control system includes a temperature sensor, a pressure sensor, and a control module; the temperature sensor has three, respectively disposed in the chilled water supply line, the return water line, and the evaporator exhaust line of the refrigeration unit; The pressure sensor is disposed in the evaporator exhaust line; the two temperature sensors and the pressure sensor are connected to the control module.

The output of the control module is connected to the control terminals of each valve, and the switches of each valve and the cooling pump are controlled according to the signals detected by the three temperature sensors and the pressure sensor.

Further, the valves are all electric valves, and automatically switch according to the signal of the control system; the specific control mode is: under normal circumstances, the full load refrigeration condition is used, and the refrigeration unit and the condenser casing are opened. The valve on the pipeline closes the other valves; when it is detected that the evaporator exhaust temperature is lowered to a preset value or the exhaust pressure is lowered to a preset value, the semi-load refrigeration condition is used to open between the refrigeration unit and the condenser casing, and to cool The valve on the pipeline between the unit and the phase change energy storage module closes other valves; when it is detected that the difference between the chilled water supply and return water temperature of the refrigeration unit is greater than a predetermined value, the emergency refrigeration condition is used to open the phase change energy storage module Close the other valves with the valve on the line between the condenser housing and the chill pump.

Further, when the valve is an electric three-way valve, the specific control mode is: normally, the full-load refrigeration condition is used, and the first inlet and the third inlet and outlet of the first three-way valve are controlled to communicate with each other. The second and third inlets and outlets of the four-way valve are in communication, and the second and third inlets and outlets of the third three-way valve are in communication, that is, the pipeline between the refrigeration unit and the condenser casing is connected, and other inlets and other valves of the valves are closed. When it is detected that the evaporator exhaust temperature is lowered to a preset value or the exhaust pressure is lowered to a preset value, the first inlet and the outlet of the first three-way valve are communicated with the third inlet and outlet by using a half-load refrigeration condition, and the fourth three The second and third inlets and outlets of the valve are in communication, and the second and third inlets and outlets of the third three-way valve are in communication, that is, a line connecting the refrigeration unit and the condenser casing; and the first and the first of the first three-way valve The two inlets and outlets are connected, the first and third inlets and outlets of the fourth three-way valve are in communication, and the first and third inlets and outlets of the second three-way valve are in communication, that is, the pipeline between the refrigeration unit and the phase change energy storage module is connected, and these are closed. Valve He enters the entrance and exit and other valves; when it is detected that the difference between the chilled water supply and return water temperature of the refrigeration unit is greater than a predetermined value, the emergency refrigeration condition is used to control the second and third inlets and outlets of the second valve to communicate with each other, and the first of the third valve The first inlet and the second inlet and outlet of the fourth valve communicate with each other, and the discharge pump is opened, that is, the pipeline between the phase change energy storage module and the condenser casing is closed, and other inlets and other valves of the valves are closed.

Further, the phase change energy storage module adopts a shell-and-tube heat exchanger or a plate heat exchanger structure, and a plurality of phase change material packages are disposed therein; and the plurality of phase change material packages are uniformly distributed in the shell Tubular heat exchanger or plate heat exchanger structure; a certain fluid passage is left between each phase change material package; a fluid inlet and outlet passage is reserved on the shell tube heat exchanger or the plate heat exchanger structure for connection refrigeration Cold water provided by the unit or other cold source; the other cold sources refer to all available natural cold water, such as low temperature lake water in summer, cooling tower water in transition season and winter, and other cold sources in parallel with the refrigeration unit.

When the phase change energy storage module adopts a shell-and-tube heat exchanger structure, the phase change material package adopts a spherical shape.

When the phase change energy storage module adopts a plate heat exchanger structure, the phase change material package adopts a flat plate type.

Further, the condenser is a water-cooled condenser, which adopts a microchannel structure or a copper tube aluminum fin structure.

Further, the condenser is a water-cooled condenser, which adopts a microchannel structure or a copper tube aluminum fin structure.

Further, the evaporator is arranged at the heating end of the communication device, and may adopt an arrangement such as an air-conditioning end between the columns, an air conditioner end of the backboard or a chip-level cooling end; these arrangements are close to the heat source, the gas transportation distance is short, and the required wind pressure is required. Small, can significantly reduce fan power consumption.

Further, the phase change energy storage package comprises a phase change material, and the phase change material used is a nano-reinforced organic material, an inorganic material or an organic-inorganic composite material, and the phase transition temperature is 0-50° C. between.

Further, the cooling pump is a small-sized DC water pump, and is connected to the mains power supply circuit and the battery power supply circuit, and can be automatically switched between the two. The mains power supply circuit includes an AC-DC power conversion module; the mains is converted to direct current by the AC-DC power conversion module to supply power to the cooling pump.

The evaporator is a heat exchanger or a plurality of parallel heat exchangers, and adopts a microchannel structure or a copper tube aluminum fin structure.

The evaporating fan is an axial fan, and is connected to the mains power supply circuit, the standby generator power supply circuit and the battery power supply circuit, and can be automatically switched between the three. The mains power supply circuit/backup generator power supply circuit includes an AC-DC power conversion module; the AC power output from the mains/standby generator is converted to DC power by the AC-DC power conversion module to supply power to the evaporating fan.

The refrigeration unit is a chilled water unit, and a centrifugal or screw type chiller unit can be used. The refrigeration unit is connected to the municipal power supply circuit and the standby generator power supply circuit at the same time, and can automatically switch between the two.

Further, the backup generator is a diesel generator, and may be a wind generator or the like.

The present invention further provides a control method for a heat pipe air conditioning system of a machine room with an emergency cooling function, wherein the heat pipe air conditioner with a room for emergency cooling is the above-mentioned heat pipe air conditioning system with an emergency cooling function, and the control method thereof is: Normally, the full load refrigeration condition is used, that is, the valve on the pipeline between the refrigeration unit and the condenser casing is opened to close other valves; when the evaporator exhaust temperature is detected to decrease the preset value or the exhaust pressure is lowered to the pre-condition When setting the value, use the semi-load refrigeration condition, that is, open the valve on the pipeline between the refrigeration unit and the condenser casing, between the refrigeration unit and the phase change energy storage module, and close other valves; when detecting the chilled water of the refrigeration unit When the water supply temperature is greater than the predetermined value and the difference between the supply and return water temperatures is less than the predetermined value, the emergency cooling condition is adopted, that is, the valve on the pipeline between the phase change energy storage module and the condenser casing and the cooling pump are opened, and the other valves are closed. And switch the power of the evaporating fan and the cooling pump to a battery.

Further, when it is detected that the chilled water supply temperature of the refrigeration unit is greater than a predetermined value, and the difference between the supply and return water temperatures is less than a predetermined value, it is determined whether the mains power failure or the refrigeration unit is faulty, and if the utility power is cut off, the standby is started. The generator switches the power of the refrigeration unit to the standby generator; after the standby generator drives the refrigeration unit to work, the operating condition is switched back to the full load refrigeration condition; if the refrigeration unit fails, the unit alarm signal is issued.

Benefits:

Compared with the existing technology, the invention is based on the principle of heat pipe refrigeration, supplemented by the application of phase change energy storage technology, and starts the standby generator and drives the refrigeration unit to work for time during the municipal power outage, thereby ensuring communication data. Uninterrupted transmission; time for the storage of communication information when the refrigeration unit fails, to ensure the safety of data communication from these two aspects; when the cold load in the night machine room is low, the cooling capacity provided by the refrigeration unit is stored by the phase change energy storage module The equipment and energy can be fully utilized. When the cold load increases during the daytime, the phase change energy storage module releases its stored cooling capacity, which can share the refrigeration pressure of the refrigeration unit, thereby reducing the peak cooling capacity provided by the refrigeration unit, that is, reducing the refrigeration unit. Installed capacity, alleviate the peak voltage of the mains; and store the cold during the night low valley price, release the cold during the daytime peak price, cool the equipment in the equipment room, can reduce the operating cost of the air conditioning system; in addition, through the phase change The storage and release of the cold storage capacity of the energy storage module, the fluctuation of the cooling capacity required by the refrigeration unit is reduced, and the refrigeration unit is extended for life.

DETAILED DESCRIPTION OF SAMPLE EMBODIMENTS

In order to make the technical means, innovative features, achievement goals and effects of the present invention easy to understand, the working principle of the invention will be further explained below with reference to specific illustrations.

Figure 1:
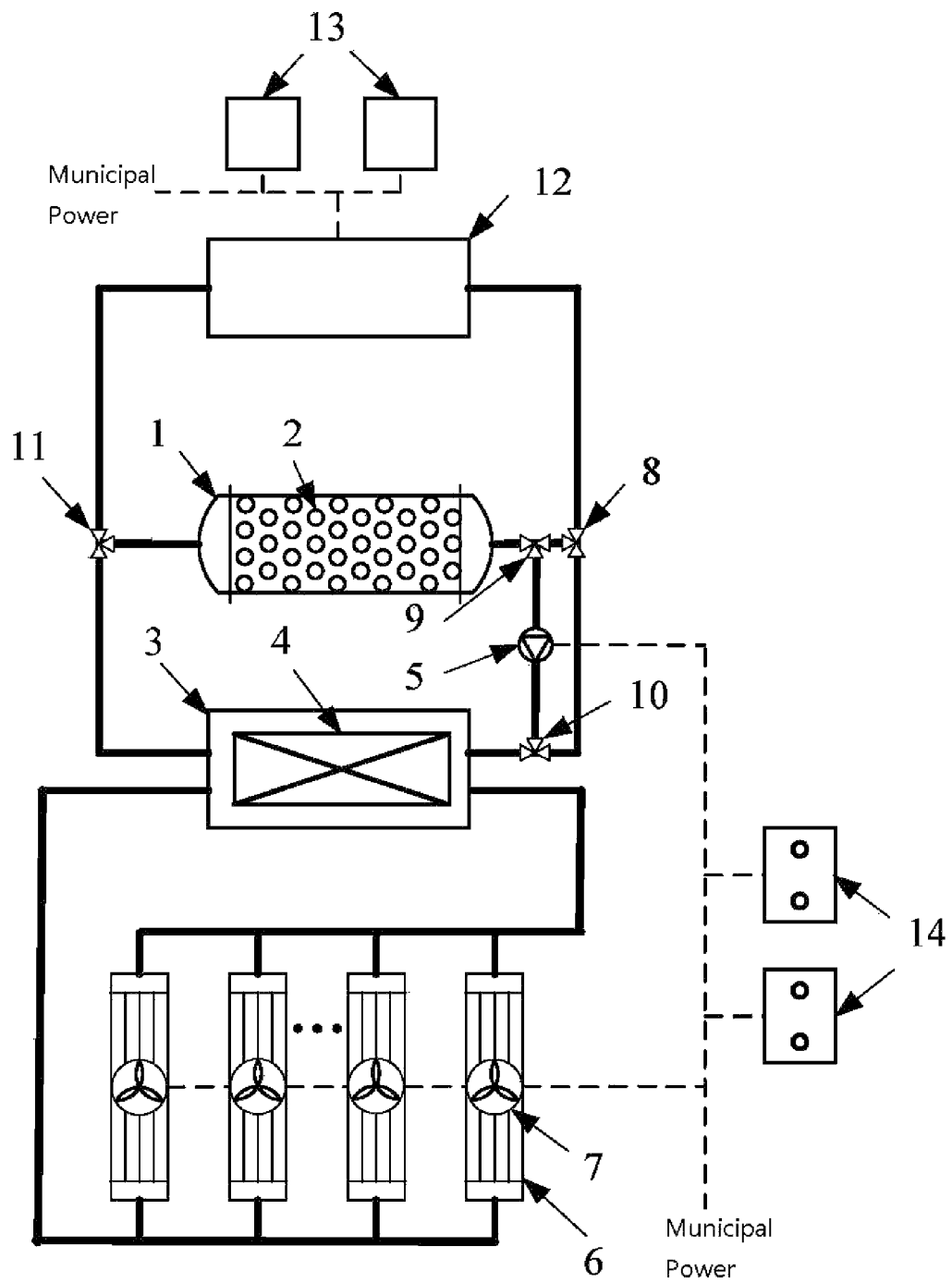
FIG. 1 is a system schematic diagram of an embodiment of the present invention.
Figure 2:
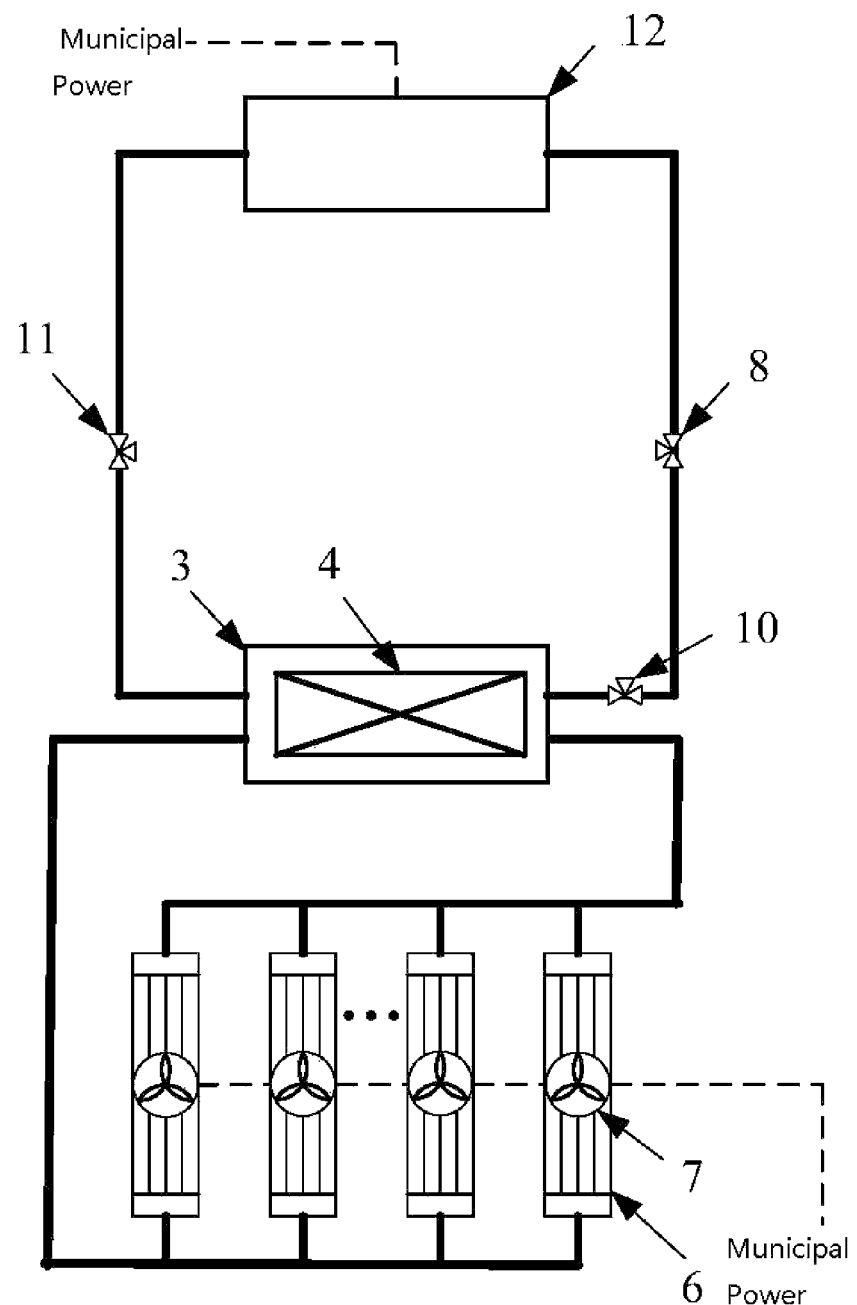
FIG. 2 is a system schematic diagram of a full load refrigeration condition according to an embodiment of the present invention.
Figure 3:
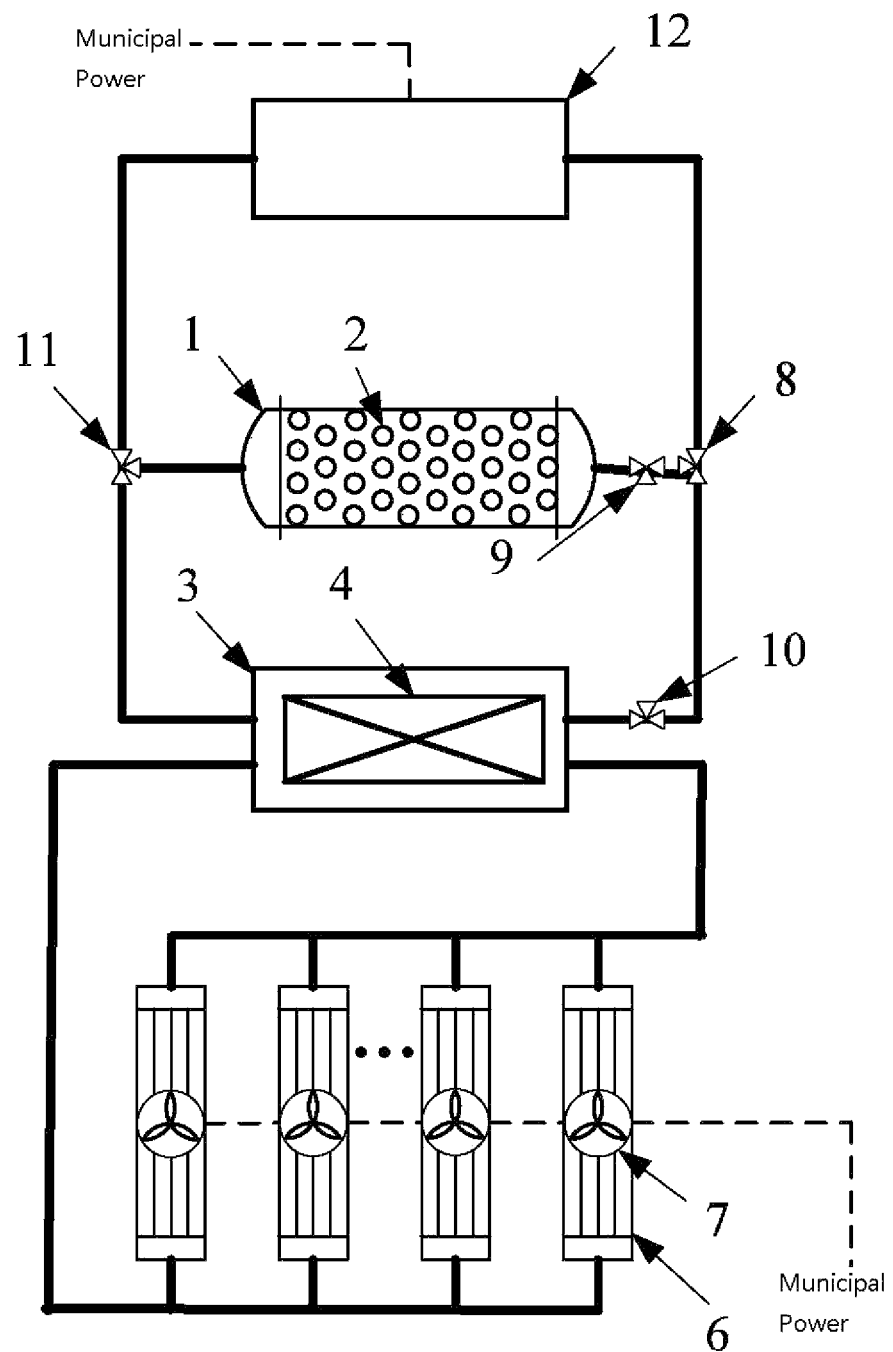
FIG. 3 is a system schematic diagram of a half load refrigeration condition according to an embodiment of the present invention.
Figure 4:
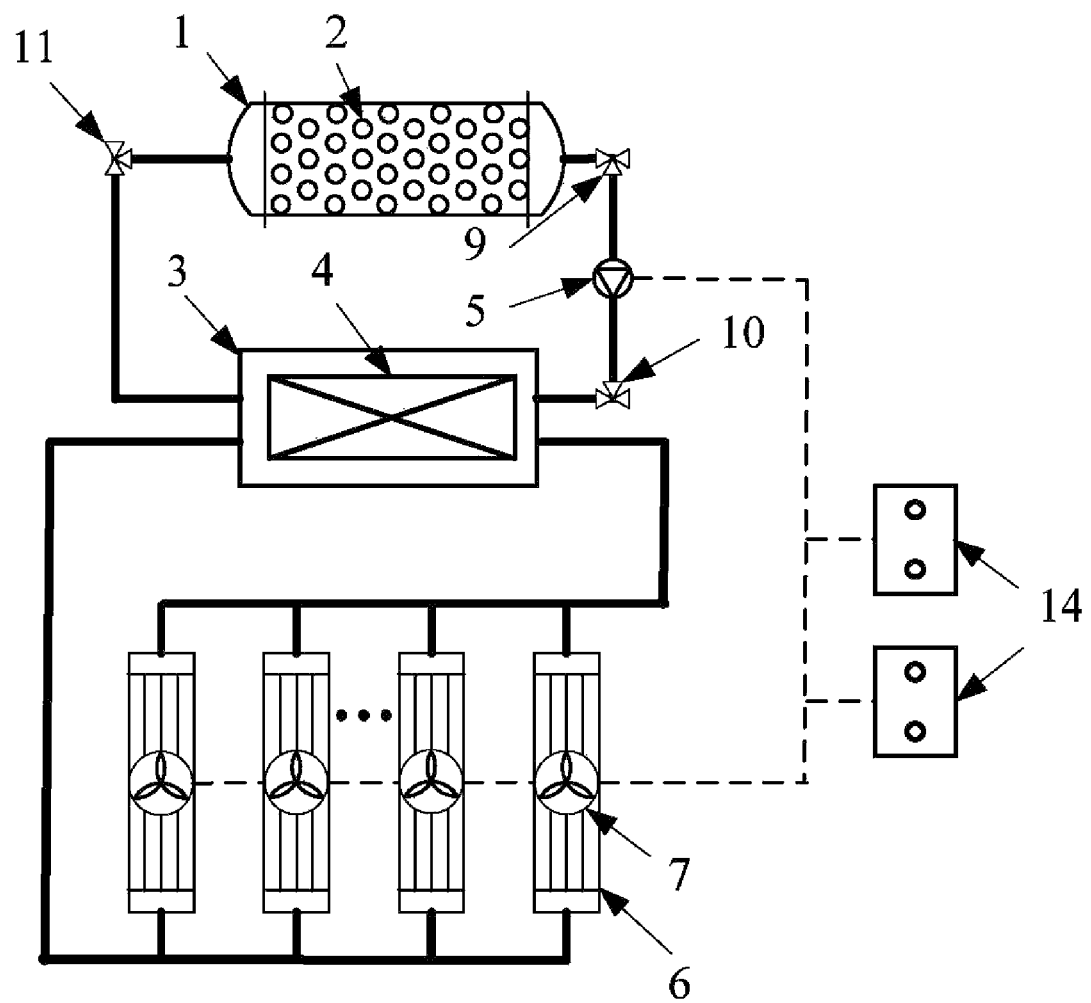
FIG. 4 is a system schematic diagram of an emergency cooling condition according to an embodiment of the present invention.

See FIG. 1, this embodiment discloses a room heat pipe air conditioning system with emergency cooling function, including phase change energy storage module 1, phase change material package 2, condenser shell 3, condenser 4, and cold pump 5, evaporator 6, evaporating fan 7, first three-way valve 8, second three-way valve 9, third three-way valve 10, fourth three-way valve 11, refrigeration unit 12, backup generator 13, battery 14 and related control system; the engine room heat pipe air conditioning system with emergency cooling function regulates operation in different environments through switches of the first three-way valve, the second three-way valve, the third three-way valve and the fourth three-way valve working conditions. The phase change energy storage module 1 adopts a shell-and-tube heat exchanger or a plate heat exchanger structure, and includes a phase change material package 2 therein. When the shell-and-tube heat exchanger structure is adopted, the phase change material is encapsulated in a spherical phase change material package, and each phase change material package is uniformly distributed in the shell-and-tube heat exchanger structure in the form of a packed bed, and each phase change material. There is a certain fluid passage between the packages. When the plate heat exchanger structure is adopted, the phase change material is encapsulated in the flat phase change material package, and the phase change material packages are uniformly distributed in the plate heat exchanger structure, and a certain fluid is left between the phase change material packages, aisle. The shell-and-tube heat exchanger or the plate heat exchanger has a fluid inlet and outlet passage reserved for connecting the cold water provided by the refrigeration unit or other cold source. The phase change material package 2 comprises a phase change material, and the phase change material used is a nano-reinforced organic material, an inorganic material or an organic-inorganic composite material, and the phase transition temperature is between 0 and 50° C. The condenser casing 3 is packaged by a shell and tube heat exchanger or a plate heat exchanger. The shell-and-tube heat exchanger or the plate heat exchanger structure reserves a fluid inlet and outlet passage to connect the cold water provided by the refrigeration unit or other cold source. The condenser 4 is a water-cooled condenser, which adopts a microchannel structure or a copper tube aluminum fin structure. The chilling pump 5 is a small DC water pump that circulates cold water between the phase change energy storage module 1 and the condenser casing 3. The evaporator 6 is one or more heat exchangers connected in parallel, adopting a microchannel structure or a copper tube aluminum fin structure. The evaporating fan 7 is an axial fan, and is connected to the municipal power supply and the battery power supply circuit, and can be freely switched between the two. The first three-way valve, the second three-way valve, the third three-way valve and the fourth three-way valve are all electric three-way valves, and automatically switch according to the signal of the control system. The refrigeration unit 12 is a chilled water unit, and can adopt a centrifugal or screw type chiller unit. The refrigeration unit is connected to the municipal power supply circuit and the standby generator power supply circuit at the same time, and can automatically switch between the two. The standby generator 13 is started when the municipal power is cut off, and drives the refrigeration unit to work; it takes a period of time to start the standby generator 13 and drive the refrigeration unit to work; during this period, the emergency cooling condition is used, and the battery is used. 14 the power supply of the cooling pump 5 and the evaporating fan 7 is required, and the electric quantity of the battery needs to satisfy the sum of the electric power consumption of the cooling pump 5 and the evaporating fan 7 during the period; after the standby generator drives the refrigeration unit to work, the operating condition is switched back. Full load cooling conditions, and the power of the evaporating fan is switched to the standby generator. Considering that in general, the backup generator 13 can be activated within 15 minutes and the refrigeration unit is driven to operate. Therefore, in this embodiment, the battery is set to meet the cooling pump 5 and the evaporating fan 7 for at least 15 minutes. The sum of the electricity consumption. The control system includes a temperature sensor, a pressure sensor and a control module, and the temperature sensor and the pressure sensor are both connected to the control module.

The invention can ensure the uninterrupted cooling demand in the data center, overcomes the shortcomings of the conventional refrigeration system that cannot be cooled in the case of a municipal power failure or a refrigeration unit failure, and uses the phase change energy storage module to store the refrigeration unit during the low communication load period. The excess cooling capacity provided is released during the peak period of the communication load, which effectively reduces the installed capacity of the refrigeration unit and improves the stability and refrigeration efficiency of the refrigeration unit. The working condition of the invention is divided into three working conditions, namely full load refrigeration condition, half load refrigeration condition and emergency cooling condition.

Full load refrigeration condition: Gravity heat pipe self-circulating cooling mode, the circulating working medium evaporates in the evaporator to absorb the heat emitted by the communication equipment, and the liquid working medium is converted into the gaseous working medium, and the gas state is driven by the density difference. The working fluid rises to the condenser, and the gaseous working medium exchanges heat with the chilled water/cold water provided by the refrigeration unit or other cold source in the condenser, and the gaseous working medium condenses into a liquid working medium and returns to the evaporator under the action of gravity. Complete refrigeration cycle. At this time, the chilled water/cold water supplied by the refrigeration unit or other cold source does not enter the phase change energy storage module, and the working circuit of the chilled water is 12-8-10-4-11-12.

Semi-load refrigeration condition: the communication load is reduced, the heat output of the communication equipment is reduced, the exhaust temperature and exhaust pressure of the evaporator are reduced; when the detected evaporator exhaust temperature is lowered by 2° C. or the exhaust pressure is lowered When it is 80% of its rated pressure, the first three-way valve, the second three-way valve and the fourth three-way valve are electrically operated to control the flow direction of the fluid in the three-way valve, so that the refrigeration unit or other cold source provides the chilled water enters the phase change energy storage module and the condenser at the same time. The phase change material in the phase change energy storage module is solidified from a liquid state to a solid state, and the cold water provided by the chilled water is stored; in addition, the chilled water provided by the refrigeration unit or other cold source is simultaneously Enter the condenser to ensure proper circulation of the circulating medium between the evaporator and the condenser. As with full-load refrigeration, the refrigerant cycle fluid circulates between the evaporator and the condenser, and the refrigeration is achieved by the evaporation and condensation process of the working fluid. However, the working circuit of the chilled water is two parallel loops, which are 12-8-9-1-11-12 and 12-8-10-3-11-12 respectively.

Emergency cooling condition: When the municipal power failure or the refrigeration unit fails, the chilled water supply temperature of the refrigeration unit will increase, and the difference between the supply and return water temperatures will increase; when the chilled water supply temperature of the refrigeration unit is detected to be greater than the predetermined temperature When the value and the difference between the supply and return water temperatures are less than a predetermined value, the second three-way valve, the third three-way valve and the fourth three-way valve are electrically operated to control the flow direction of the fluid in the three-way valve, and start at this time The battery supplies power to the cooling pump and the evaporating fan, and changes the working circuit of the chilled water to circulate the chilled water between the phase change energy storage module and the condenser. At this time, the phase change energy storage module acts as a cold source of the air conditioning system to achieve condensation. The temperature of the device is cooled, and the working circuit of the chilled water is 1-9-5-10-3-11-1.

The invention is based on the principle of heat pipe refrigeration, supplemented by the application of phase change energy storage technology, to ensure the uninterrupted cooling demand in the data center, and overcome the shortcomings of the conventional refrigeration system that cannot be cooled in the case of municipal power failure or refrigeration unit failure. When the municipal power is cut off, the standby generator starts and drives the refrigeration unit to work for time, which can ensure the uninterrupted transmission of communication data; when the refrigeration unit fails, it will gain time for the storage of communication information, and ensure the security of data communication from these two aspects; When the cold load in the night machine room is low, the phase change energy storage module stores the cooling capacity provided by the refrigeration unit, which can make full use of equipment and energy. When the cold load increases during the daytime, the phase change energy storage module releases its stored cooling capacity and can share The cooling pressure of the refrigeration unit, thereby reducing the peak cooling capacity provided by the refrigeration unit, that is, reducing the installed capacity of the refrigeration unit, easing the peak voltage for the mains; and storing the cold during the night low valley price, releasing the cold during the daytime peak price Quantity, cooling equipment in the equipment room, can reduce the operating cost of the air conditioning system; in addition, through phase change energy storage The amount of cold mass storage and release action, the amount of cooling required volatility refrigeration unit decreases, extend the working life of the refrigeration unit.

What is claimed is:

1. A machine room heat pipe air conditioning system with an emergency cooling function, comprising;
    a refrigeration unit;
    a phase change energy storage module;
    a phase change material package;
    a condenser shell;
    a condenser;
    an evaporator;
    a backup generator; and
    a battery;
        wherein the phase change material package is located in the phase change energy storage module; the condenser is located in the condenser shell; the condenser and the evaporator are connected by a pipeline to form a refrigerant circulation circuit; cold water circulation loops are formed between the refrigeration unit and the condenser shell, between the refrigeration unit and the phase change energy storage module, and between the phase change energy storage module and the condenser shell through pipelines; valves are installed on the pipelines between the refrigeration unit and the condenser shell, between the refrigeration unit and the phase change energy storage module, and between the phase change energy storage module and the condenser shell; a cooling pump is installed on the pipeline between the phase change energy storage module and the condenser shell; an evaporator fan is installed on the evaporator; the working power of the refrigeration unit is provided by the city power or the backup generator, the working power of the evaporation fan is provided by the city power, the backup generator or the battery, the working power of the cooling pump is provided by the city power or the battery.

2. The heat pipe air-conditioning system for a computer room with an emergency cooling function according to claim 1, wherein the valve is a three-way valve connected through a specific connection method wherein
    the first inlet and outlet of the first three-way valve are connected to the outlet of the refrigeration unit through the pipelines, and the second and third inlets and outlets are connected to the phase change energy storage module and the inlet of the condenser shell through the pipelines respectively; The first and second inlets and outlets are connected to the outlet of the phase change energy storage module and the condenser shell through the pipelines, and the third inlet and outlet are connected to the inlet of the refrigeration unit; the second inlet and outlet of the first three-way valve is connected to the tube to the phase change energy storage module, A second three-way valve is provided on the pipelines, The first and second inlets and outlets of the second three-way valve are provided on the pipeline, The third inlet and outlet are connected to the inlet of the cooling pump through the pipelines, and the outlet of the cooling pump is connected to the first inlet and outlet of the third three-way valve through the pipelines, the second and third inlets and outlets of the third three-way valve are arranged on the pipeline from the third inlet and outlet of the first three-way valve to the condenser shell.

3. The heat pipe air-conditioning system for a computer room with an emergency cooling function according to claim 1, further comprising a control system wherein the control system includes three temperature sensors, a pressure sensor, and a control module; wherein the three temperature sensors are respectively arranged in a chilled water supply line, a return water line and an evaporator exhaust line of the refrigeration unit; and the pressure sensor is provided in the evaporator exhaust line; the three temperature sensors and the pressure sensor are connected to the control module;
    and the control module is connected to each valve, and controls the switching of each valve and the cooling pump according to the signals detected by the three temperature sensors and the pressure sensor.

4. The heat pipe air-conditioning system for an equipment room with an emergency cooling function according to claim 1, wherein the phase-change energy storage module uses a shell-and-tube heat exchanger or a plate heat exchanger structure, and a plurality of phase-change material packages are provided therein; multiple phase-change material packages are evenly distributed in the shell-and-tube heat exchanger or plate heat exchanger structure; certain fluid passages are left between the phase-change material packages; the shell-and-tube heat exchanger or the plate type heat exchanger structure is provided with a fluid inlet and outlet channel for connecting the cold water provided by the refrigeration unit or other cold sources; other cold sources refer to all available natural cold water, such as low-temperature lake water in summer, cooling in the transition season and winter tower water, other cooling sources are connected in parallel with the refrigeration unit;
    when the phase change energy storage module uses a shell and tube heat exchanger structure, the phase change material package uses a spherical shape;
    When the phase change energy storage module uses a plate heat exchanger structure, the phase change material package adopts uses a flat plate type.

5. The heat pipe air-conditioning system for an engine room with an emergency cooling function according to claim 1, wherein the condenser shell uses a shell and tube heat exchanger or a plate heat exchanger structure; and a shell and tube heat exchanger or a plate heat exchanger structure has a fluid inlet and outlet passage reserved for connection with cold water provided by a refrigeration unit or other cold sources.

6. The heat pipe air-conditioning system for an equipment room with an emergency cooling function according to claim 1, wherein the evaporator is arranged at a heating end of a communication device, and uses an end-to-column air-conditioning end, a back-board air-conditioning end, or a chip-level cooling end layout form.

7. A control method for a computer room heat pipe air conditioning system with an emergency cooling function, characterized in that the computer room heat pipe air conditioning system with an emergency cooling function is the one with an emergency cooling function according to claim 3, the control method of the heat pipe air-conditioning system in the computer room comprising the actions of: under normal conditions, the full load refrigeration mode being adopted wherein the valve on the pipeline between the refrigeration unit and the condenser shell are opened, and other valves are closed;

when the evaporator exhaust temperature is detected to decrease, when the preset value or the exhaust pressure is lowered to the preset value, the half-load refrigeration mode being adopted wherein the valves on the pipeline between the refrigeration unit and the condenser shell, and between the refrigeration unit and the phase-change energy storage module are opened, and the others are closed valve;

when it is detected that the chilled water supply temperature of the refrigeration unit is greater than a predetermined value, and the difference between the supply and return water temperatures is less than a predetermined value, an emergency refrigeration mode being adopted, wherein the valve on the pipeline between the phase change energy storage module and the condenser shell and the cooling pump is opened, other valves are closed, and the power of evaporation fan and cooling pump is switched to battery.

8. The method for controlling a heat pipe air-conditioning system for a computer room with an emergency cooling function according to claim 7, comprising the actions of: when it is detected that the temperature of the chilled water supply of the refrigeration is greater than a predetermined value, and the difference between the temperature of the supply and return water is less than the predetermined value, determining whether it is due to the main power failure or the refrigeration unit failure; and if it is due to the mains power failure, staring the standby generator and switching the power of the refrigeration unit to the standby generator; Waiting after the standby generator driving the refrigeration unit to work, the full load refrigeration mode is started; if it is due to the refrigeration unit failure, issuing a unit alarm signal.

* * * * *